Jan. 4, 1966 C. G. THORNTON 3,227,580

METHOD FOR IMPROVING THE ELECTRICAL CHARACTERISTICS OF GERMANIUM SEMICONDUCTOR DEVICES

Filed Nov. 16, 1961

INVENTOR.
CLARENCE G. THORNTON
BY Albert L. Free
AGENT

United States Patent Office 3,227,580
Patented Jan. 4, 1966

3,227,580
METHOD FOR IMPROVING THE ELECTRICAL CHARACTERISTICS OF GERMANIUM SEMICONDUCTOR DEVICES

Clarence G. Thornton, Ambler, Pa., assignor, by mesne assignments, to Philco Corporation, Philadelphia, Pa., a corporation of Delaware Filed Nov. 16, 1961, Ser. No. 152,745
18 Claims. (Cl. 117—213)

This invention relates to methods for making germanium semiconductor devices, and particularly to methods for treating the surface of a region of a body of germanium containing a rectifying barrier and for thereby improving the electrical characteristics of the device.

In making a germanium semiconductor device such as a diode or transistor a rectifying barrier is produced in a body of germanium, which barrier ordinarily extends from within the body to a surface region thereof. In operation of the device, voltages are applied between opposite sides of the rectifying barrier in the reverse, or current-blocking, direction and produce electrical stresses across the intervening material of the region containing the barrier which tend to cause substantial, undesired leakage-current flow across, or even complete breakdown of, the reverse-biased barrier. Such leakage current can arise from the portion of the barrier region lying within the germanium body or from the portion of the barrier region at the surface of the body. Leakage current arising from the barrier region within a body is determined by properties which can be accurately controlled and reproduced so that under the intended operating conditions of the device the reverse leakage current from this source is minimized. However the leakage current arising from the portion of the barrier region at the surface of the semiconductor depends so strongly upon exceedingly minute differences in surface conditions produced during the fabrication process or thereafter, that it has not heretofore been possible to minimize and to control effectively this surface leakage current.

As an example, in a germanium transistor having an alloy-junction or surface-barrier collector connection the leakage current which flows through the collector for various reverse voltages, in the absence of emitter current, is strongly influenced by the exact nature and condition of the surface at which the collector barrier terminates. Generally the reverse leakage current has a relatively low and nearly constant value in a range of low reverse voltages but increases more and more rapidly toward extremely high values for reverse voltages above said range. The reverse leakage current in the low-voltage range is conventionally termed $I_{CO}$, and the voltage at which the current rises above a predetermined value greater than $I_{CO}$ is conventionally termed the collector-to-base break-down voltage $V_{CB}$. As is well known, in most circuit applications of the transistor it is desirable that the leakage current $I_{CO}$ be as low as possible, and the breakdown voltage as high as possible. However in devices made by prior art methods it has been found that the $I_{CO}$ is generally higher, and/or the breakdown voltage generally lower, than is desirable for many applications, either initially or after the device has been in existence for a substantial time, due to excessive surface leakage currents.

Accordingly it is an object of my invention to provide an improved method for the making of germanium semiconductor devices.

Another object is to provide a method for producing, in semiconductive germanium bodies, rectifying barriers which are characterized by higher breakdown voltages.

A further object is to provide a method for producing rectifying barriers in germanium semiconductive bodies which are characterized by lower reverse currents at a given reverse voltage.

Still another object is to provide a method for making germanium transistor devices having smaller collector reverse currents.

It is also an object to provide a method for making germanium transistor devices in which the emitter reverse-current is less for a given reverse voltage.

Still another object is to provide a method for making rectifying connections to germanium which are characterized by reduced values of $I_{CO}$.

These objects are achieved in accordance with the invention by applying a liquid containing meta-germanic acid to a portion of the surface of a germanium semiconductor which includes a rectifying barrier, and causing the acid to dry thereon in a controlled environment. For example in the case of a rectifying connection to a germanium transistor, such as the collector connection, the connection and the adjacent germanium are first cleansed thoroughly, as by etching followed by rinsing with pure water, the meta-germanic acid is applied to the cleansed surface and dried thereon by evaporation, and the body and connection are then encapsulated in an inert ambient and preferably baked thereafter in conventional manner.

I have found that by this method the breakdown voltage of rectifying connections to germanium is increased, and/or the low-voltage reverse current $I_{CO}$ of such connections decreased. This enhancement of the electrical properties of rectifying connections is believed to be due to the rapid formation by the dried meta-germanic acid of a relatively thick layer of germanium oxide chemically bonded to the surface of the germanium over and adjacent the barrier region, which layer protects the barrier-containing surface of the germanium from contamination and also provides a suitable termination for the electrical bonds of the surface germanium atoms.

Other objects and features of the invention will be more readily appreciated from a consideration of the following detailed description taken in connection with the accompanying drawings, in which.

Figure 1:
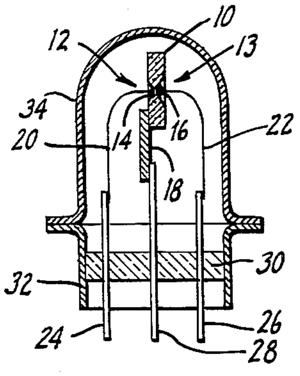
FIGURE 1 is a cross-sectional representation illustrating one type of germanium semiconductor device in the fabrication of which the method of the invention may be employed.

Although not limited thereto, the invention will first be described as it may be applied to the fabrication of the so-called micro-alloy diffused transistor (MADT) such as is described in the copending application Serial No. 56,619, of Richard A. Williams, filed September 1, 1960, now United States Patent No. 3,096,259, entitled Method for Manufacturing Semiconductor Device. Such a device is represented in cross-section in FIGURE 1, in which the various parts are not necessarily to scale. In a typical form the transistor comprises an N-type single-crystalline base wafer 10 having concentric, circularly-symmetrical opposed pits 12 and 13 in opposite surfaces thereof, a circular emitter connection 14 at the bottom of the pit 12, and a concentric and somewhat larger collector connection 16 on the bottom of pit 13. A metal base tab 18 is ohmically affixed to the base wafer 10. An emitter lead 20 and a collector lead 22 are spot-welded to the conductive supporting pins 24 and 26 respectively, and the base tab 18 is similarly connected to a conductive supporting pin 28. The pins 24, 26 and 28 are in turn supported and insulated from each other by a non-conductive disc 30 through which they pass. The insulating disc 30 fits tightly into and is supported by a surrounding flanged metal cylinder 32, and the active parts of the device are enclosed by the generally-cylindrical flanged metal cap 34 bonded at its flange to the flange of member 32. The space within the cap 34 is hermetically sealed from the exterior in known manner, and is filled with an impurity-free controlled ambient such as a dry inert gas or a suitable potting material.

Figure 2:
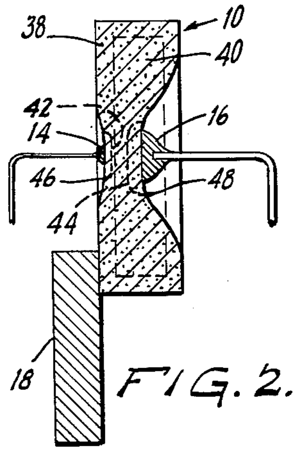
FIGURE 2 is a more detailed cross-sectional representation of a portion of the device represented in FIGURE 1.

In FIGURE 2, which is not necessarily to scale and in which numerals corresponding to those of FIGURE 1 indicate corresponding parts, the active portion of the transistor of FIGURE 1 is represented in further detail. As shown, the emitter connection 14 is located upon a thin surface layer 38 in the N-type base 10 which in practice is ordinarily many times thinner than base 10. This layer 38 has a graded resistivity which is lowest at the exterior and progressively higher at points farther within the base. The collector connection 16 is located upon the higher resistivity interior 40 of the base 10, or in some cases upon the higher resistivity interior side of the diffused layer 38. In either event connection 16 is made to a portion of the base wafer 10 having a resistivity many times greater than the portion of the base on which emitter connection 14 is located.

The emitter connection 14 and the collector connection 16 are so-called micro-alloy contacts formed by a brief, low-temperature alloying of the acceptor-type metal of the external parts of the connections with the immediately underlying portions of the semiconductive base. As is well known the result of this operation is to produce P-N junctions, designated 42 and 44, in the germanium beneath the emitter connection and the collector connection respectively. Each of these P-N junctions extends substantially parallel to the interior surface of the metal portion of the corresponding connection and completely separates this metal portion from the remainder of the base wafer 10. The P-N junctions 42 and 44 extend to the surface of the base 10 around the respective peripheries of the emitter and collector connections, as at 46 and 48 for example. As is also well known, a rectifying potential barrier exists along each of the P-N junctions 42 and 44 respectively, separates each of the emitter and collector connections from the adjacent base material, and extends to the surface of the wafer 10 around the periphery of each of the emitter and collector connections as at 46 and 48 respectively.

In normal operation of the transistor the collector connection 16 is biased negatively with respect to the base connection 18 so that the rectifying barrier asociated with the collector P-N junction 44 is biased in its reverse direction, i.e., the direction of more difficult conduction. In certain conditions of operation, e.g. when the transistor is cut-off, the emitter connection 14 is also biased negatively, i.e. in the reverse direction, with respect to the base connection 18. For most uses of the transistor it is desirable, and in many cases essential, that the emitter and collector connections, when reverse-biased, pass the least possible amount of current. Theoretically the only current which need flow when either connection is reverse-biased is an extremely small current at low reverse voltages due to normal thermal agitation of carirers in the semiconductive body in the vicinity of the associated rectifying barrier, and a very large current occurring abruptly when the reverse voltage is increased beyond a critical value. However in practice the reverse leakage current of the rectifying connection at a given reverse voltage has generally been greater than the theoretical minimum value, at least for some values of reverse voltage, due to adverse surface conditions in the region where the rectifying barrier reaches the surface of the germanium. The nature of this excess current in the particular transistor type shown in FIGURES 1 and 2 is illustrated in FIGURE 3.

In the latter figure ordinates of the graph represent current flowing through the reverse-biased collector connection 16 while abscissae represent the reverse voltage applied between connection 16 and base connection 18. The full-line curve A of FIGURE 3 represents the reverse current-voltage characteristic of a collector connection made by prior art methods, for zero emitter current. As shown, for a substantial range of small reverse voltages the reverse current is relatively low and substantially constant, and it is the value of reverse current in this low-voltage range which is commonly termed the $I_{CO}$ of the transistor. Above this low-voltage range the reverse current increases at an increasing rate until at the value indicated at $V_{CB2}$ the current is so great that the collector connection no longer has any substantial resistance. However, as shown, even below the voltage $V_{CB2}$ the reverse current rises very substantially above the $I_{CO}$ value existing at lower voltages, and accordingly the breakdown of the collector is gradual and no unique value of breakdown voltage can be specified independently of the current. Because of this it has been common to specify the breakdown voltage $V_{CB}$ of the collector connection as the voltage at which the collector reverse current exceeds some preselected value, such as the value $I_1$ shown in FIGURE 3, above which current value the transistor is unsatisfactory for its intended purpose. For a collector connection made in accordance with the prior art and having the characteristics shown by curve A, the breakdown voltage for the current $I_1$ is therefore $V_{CB1}$.

Figure 3:
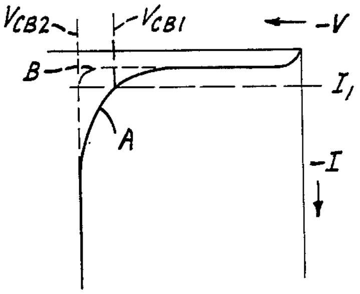
FIGURE 3 is a graphical representation showing certain electrical characteristics of devices of the type represented in FIGURE 1.

It has been found that, depending on the exact conditions at the surface of the germanium occupied by the rectifying barrier, the reverse-current breakdown of the collector connection may be more abrupt than that represented by curve A, so that the reverse-current characteristic in the region near the voltage $V_{CB2}$ at which the collector becomes substantially a short circuit has more nearly the form represented by the dashed line B in FIGURE 3. In a device having the characteristic B the useful breakdown voltage at which the reverse current rises above the specified value $I_1$ is greater than in a device having the characteristic A, and in fact is substantially equal to the voltage $V_{CB2}$ at which collector resistance disappears. Accordingly if the germanium in the barrier region is provided with the proper surface conditions the useful breakdown voltage can be increased by the difference between $V_{CB2}$ and $V_{CB1}$, or at least by a substantial part of this difference.

It will be understood that due to the extreme sensitivity of the electrical characteristics of transistors to small variations in conditions existing during fabrication, certain characteristics thereof such as the reverse current-voltage characteristics exhibit substantial variations from unit to unit, and accordingly it is necessary to determine improvements in processing from a statistical viewpoint. For example an improvement in the fabrication process is realized if the average of the collector breakdown-voltage of many transistors is increased, or if the percentage of transistors having collector-breakdown voltages above a predetermined value is increased.

Prior to the invention it was known that the breakdown voltage of a transistor collector is strongly affected by the presence on the surface containing the barrier of impurities in trace quantities too small to be detected, as well as by any substances on this surface which tend to affect adversely the manner in which the valence bonds of the germanium at the surface of the semiconductive body are terminated. In the prior art the principal attempt at controlling these surface conditions comprised efforts to provide complete purity of the surface by providing clean working conditions, by scrupulously cleansing the surface, and by carefully potting and sealing the final device. Some efforts were also made in the prior art to treat the surface so as to produce stable, beneficial conditions thereon, but these did not prove successful in providing the desired improvements in breakdown voltage.

Figure 4:
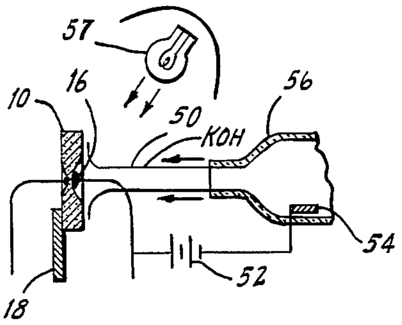
FIGURES 4–8 are cross-sectional representations illustrating arrangements for performing various steps in preferred embodiments of the invention.
Figure 5:
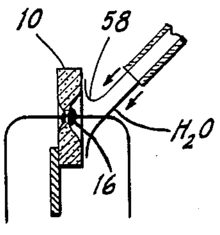

Before applying the method of treatment which is the subject of my invention, the transistor of FIGURES 1 and 2 may first be constructed and prepared in accordance with techniques known in the prior art, which are described in said application of R. A. Williams and are generally as follows. An intrinsic wafer 10 of N-type semiconductive germanium is provided with the surface skin 38 by diffusion of N-type impurities into the surface. The emitter and collector pits 12 and 13 are formed by jet-electrolytic etching, and the emitter and collector connections 14 and 16, which preferably comprise dots of cadmium, are formed by jet-electroplating followed by a very small amount of alloying. The emitter and collector leads 20 and 22, which may be of silver, and the ohmic base connection 18, which may be of nickel, are applied by conventional soldering techniques. To remove from the semiconductive surface most of the many types of impurities which may be produced thereon during the foregoing process, the device is typically etched. As represented in FIGURE 4, electrolytic etching may be employed by directing a jet 50 of an electrolyte such as potassium hydroxide against the collector connection and the surrounding semiconductive material while the collector connection is maintained positive with respect to the electrolyte by means of battery 52 and an inert electrode 54 located in the jet-forming nozzle 56. As an example, a current of 100 mils may be applied for 1.5 seconds using a jet of 30 mils diameter, while intense illumination is focused onto the collector connection from a light source 57. The result of this treament is to remove semiconductive material and impurities located thereon, especially immediately adjacent the collector connection 16. The collector connection 16 and the surrounding semiconductor are then rinsed thoroughly for about 5 minutes in a jet or stream 58 of pure, deionized water as shown in FIGURE 5 to remove any contaminants remaining on the wafer adjacent the collector, especially deposits formed by the potassium hydroxide itself. Following such rinsing the next step in accordance with the prior art was to blow off as much of the rinse water as possible with a jet of dry and pure inert gas and to vacuum-bake the transistor immediately by placing it in a chamber at elevated temperature and reduced gas pressure. Following this the unit would be encapsulated, sealed and baked, for example for 100 hours at 85° C.

Figure 6:
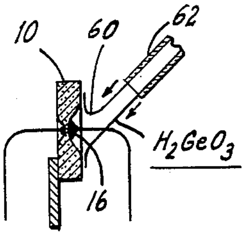
Figure 7:
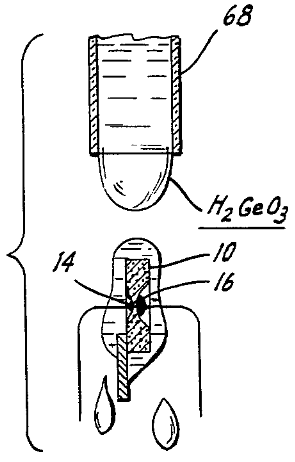
Figure 8:
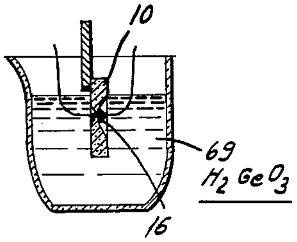

In accordance with the invention, however, immediately after the water rinse and prior to the vacuum-baking operation the collector connection and its surrounding semiconductive surface are bathed with meta-germanic acid ($H_2GeO_3$), which is germanium dioxide dissolved in water. As represented in FIGURE 6 the meta-germanic acid may be applied in the form of a stream 60 from a nozzle 62 and is preferably applied immediately after rinsing while the germanium is still wet. However the exact manner of application is not critical; for example as represented in FIGURE 7 the solution may be dripped onto the wafer from a tube 68 located above the wafer, and allowed to run over the collector side of the wafer; or, as shown in FIGURE 8 the wafer may be dipped into a bath 69 of the $H_2GeO_3$ solution so that the collector connection and the surrounding material are immersed in the bath. The time of application of the solution is not critical, five to fifteen seconds of application being typical. Following application of the meta-germanic solution, droplets of excess solution may be blown off with a stream of warm dry nitrogen, although this is not essential. The treated wafer is then dried by evaporation, preferably by placing it immediately in the vacuum-baking chamber mentioned hereinbefore. Typically the chamber is operated at a temperature of about 120° C. and a pressure of about one micron of mercury. After this, normal encapsulation and sealing techniques may be utilized to complete the device, which is then preferably baked in conventional manner at about 85° C. for about 100 hours. It is understood that in all those steps following etching, precautions familiar in the transistor art should be taken to prevent harmful impurities or contaminants from reaching the transistor surfaces.

The collectors of transistors so made then exhibit, in general, an abrupt type of collector breakdown corresponding to a reverse characteristic like that shown at B in FIGURE 3 as contrasted with the rounded characteristic shown at A. Accordingly on the average the reverse leakage currents of collector connections made by my new method do not rise above the reference value $I_1$ until the reverse voltage exceeds substantially the collector breakdown voltage $V_{CB1}$ obtained by the prior art process. Therefore by my invention the average collector breakdown voltage of transistors, and the yield of transistors having a collector breakdown voltage $V_{CB}$ greater than a specified value, are substantially increased.

Improvements in collector breakdown voltage of about 10 volts have been obtained routinely, and improvements of 20 to 30 volts are not uncommon, when employing my meta-germanic acid treatment. The precise amount of improvement obtained in any given case depends upon the degree to which unavoidable traces of contaminants are present in the ambient at the time, the smaller improvement of about 10 volts being obtained when ambient conditions happen to be optimum. In this connection it will be understood that in the particular type of transistor represented in FIGURES 1 and 2 the voltage at which breakdown of the collector connection occurs is larger for transistors having larger thicknesses of germanium between the opposed emitter and collector junctions, whether or not my invention is utilized, and the amount of improvement in useful breakdown voltage produced by my invention generally increases with the value of breakdown voltage produced by prior art methods. For example I have found that a 10 volt increase in useful breakdown voltage from 100 to 110 volts is as easily obtainable with my invention as is a 5 volt increase from 50 to 55 volts. Furthermore it will be understood that over long periods of time there is a tendency for the useful breakdown voltage of the collector of a conventional transistor to decrease gradually with time of storage, and such a tendency also exists in collectors treated in accordance with my invention. However tests have established that a transistor collector treated in accordance with my invention is initially superior to a conventional collector and maintains its superiority even after long periods of storage.

Because of the above-mentioned increase of breakdown voltage with emitter-to-collector junction spacing in the type of transistor shown in FIGURES 1 and 2, my invention may not only be used to increase the breakdown voltage for a given spacing but may also be used to permit a decrease in emitter-to-collector spacing for a given required breakdown voltage. This decrease in spacing then improves the high-frequency capabilities of the device.

The exact procedure used in preparing the meta-germanic acid solution utilized in accordance with the invention is not critical, provided that care is taken in maintaining the purity of its constituents. The pH of the solution is preferably between about 3.1 and 3.5 but values somewhat on either side of this range may be utilized if desired. If the pH is made excessively low the solution becomes highly acidic and in some cases may tend to attack metal elements of the transistor device and thus introduce impurities on the germanium surface, while if the pH is made excessively large it will not be as effective in providing the desired layer of oxide. Similarly while a saturated solution of meta-germanic acid is preferred, a weaker solution may be utilized but then excessive drying may be required to remove the additional water.

One preferred method for preparing a solution is as follows: 8 grams of pure germanium dioxide are added to 992 grams of distilled or deionized water, and the solution is heated in a beaker at a slow boil while stirring continuously until the solution becomes clear. Usually about one-half hour is required for this. During boiling the beaker is preferably closed with a cover glass to minimize contamination and evaporation losses. The solution is then cooled to room temperature and deionized water added to compensate for any loss due to evaporation. The pH of the solution is determined by removing a small portion of the solution and measuring it in conventional manner. Preferably the solution is adjusted so that the pH falls within the range of 3.1 to 3.5 and the conductivity thereof does not exceed $5\times10^{-4}$ mho per centimeter at 25° C. If the pH is initially below 3.1 but above 2.8, the pH is raised by adding dilute ammonium hydroxide. If the pH before adjustment is below 2.8 the solution is preferably discarded and reconstituted. If the pH is initially above 3.5 it is reduced by adding 0.01 normal HCl. The germanium dioxide utilized in making the solution should not contain excessive amounts of insoluble (tetragonal) germanium dioxide or of free hydrochloric acid. If it does it will produce a cloudy solution, or a solution with a pH below 2.8 and a conductivity above $5.0\times10^{-4}$ mho per centimeter. In this event the solution should be reconstituted using germanium dioxide which has been converted to the glassy amorphous form by heating to 1115° C. and then cooling rapidly. The amorphous form of germanium dioxide is both completely soluble and free of hydrochloric acid.

As described above the preferred meta-germanic acid solution may contain ammonium or chloride ions in addition to $GeO_2$ and water, due to the reagents which may be added to adjust the pH. Oxidizing agents such as oxygen have also been dissolved in the solution with excellent results, and solutions containing dissolved nitrogen have been used successfully. Accordingly it is not necessary that only meta-germanic acid be present in the solution, so long as significant amounts of harmful impurities are excluded therefrom.

While in the foregoing example a water rinse precedes application of the meta-germanic acid solution, this water rinse may be replaced by rinsing with the meta-germanic acid solution itself. Thus the step illustrated in FIGURE 5 may be omitted and the stream of $H_2GeO_3$ solution applied as shown in FIGURE 6 for a time sufficient to accomplish the desired rinsing action. However use of a water rinse is preferred because of the expense of using meta-germanic acid, instead of deionized water, for this purpose.

While the foregoing description has been with particular reference to treatment of the collector of a transistor, it will be understood that the same process may be applied to the emitter of a transistor, and in fact the application of the $H_2GeO_3$ solution to the collector by the drip or dip methods illustrated in FIGURES 7 and 8 respectively also provides simultaneous treatment of the emitter. Since in the device of FIGURES 1 and 2 the emitter is located on germanium having a resistivity many times lower than that adjacent the collector, the emitter breakdown voltage and the improvements therein produced by my method are in general much smaller than those obtained for the collector, but nevertheless significant improvements in emitter breakdown voltage are produced by treatment of the emitter in accordance with my invention. For example the average emitter breakdown voltage for devices of the type shown in FIGURES 1 and 2 has been increased from 5 volts to 6 volts by my treatment.

Furthermore my invention is not limited to making devices of the micro-alloy diffused type illustrated in FIGURES 1 and 2, but is applicable to any device in which a rectifying barrier exists at an exposed surface of a germanium body. For example it may be used to reduce the reverse leakage current in a surface-barrier rectifying connection to germanium. One device using such connections is the surface-barrier transistor described in U.S. Patent No. 2,885,571 of R. A. Williams and J. W. Tiley, issued May 5, 1959 and entitled Semiconductor Device. In this device the emitter and collector connections are metal dots usually of indium, which are not alloyed with the germanium, the rectifying barrier in each case being produced at the interface between the metal and the germanium and hence intersecting the surface in a region contiguous with the periphery of the metal dots. In this device the reverse voltage which can be applied to the collector is usually limited by the phenomenon known as "punch-through" of the collector to the emitter, rather than by collector breakdown. That is, due to punch-through the collector current rises abruptly to high values at a predetermined collector voltage less than the collector breakdown voltage, regardless of the surface condition. Accordingly my method is not ordinarily used to increase the reverse voltage at which a given reverse collector current occurs in a surface-barrier transistor. Instead it is generally used in a surface-barrier transistor to decrease the so-called $I_{CO}$, i.e., the reverse leakage current of the collector in the range of relatively low collector voltages below punch-through for which the reverse current is nearly constant.

Figure 9:
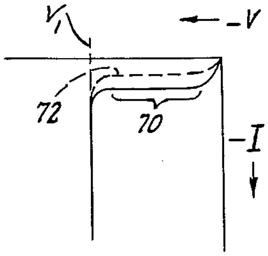
FIGURE 9 is a graphical representation illustrating certain electrical characteristics of another type of device made by the invention.

The reverse current-voltage characteristics of the collector of a typical surface-barrier transistor of the prior art is represented by the solid-line curve of FIGURE 9, in which abscissae represent reverse collector-to-base voltage and ordinates represent reverse collector current. The $I_{CO}$ is indicated by the ordinate of the nearly-horizontal portion 70 of the curve and the punch-through voltage by the voltage $V_1$ at which a sharp increase in current occurs. The collector is normally operated at reverse voltages below punch-through and, since in most uses of the transistor it is desired that no current flow through the reverse-biased collector in the absence of emitter current, the leakage current $I_{CO}$ should be made as small as possible. In the surface-barrier transistor the clean-up etching is customarily performed with an acid chemical etchant, rather than electrolytically, and conventional treatment of the collector connection and surrounding germanium has been inadequate to prevent the existence of a substantial leakage current $I_{CO}$. However by treating the collector of the surface-barrier transistor, after the chemical clean-up etch, in the manner described hereinbefore with reference to the micro-alloy diffused transistor, a lower value of $I_{CO}$ is obtained as indicated by the dashed-line 72 in FIGURE 9. Again the improvement in $I_{CO}$ is a statistical improvement, the perecntage of transistors which have an $I_{CO}$ less than a preselected value, e.g., 5 microamperes, being increased in a typical case by a factor of at least (as great as) 2.

Since the improvements with which my invention is concerned depend upon the exact atomic nature and order of the surface of the germanium it is difficult to determine and specify in detail exactly what effect my treatment has on the structure of the germanium surface. However as a result of observation and analysis I believe that the significant action is the rapid formation by the meta-germanic acid, as it dries on the germanium surface, of a relatively thick germanium oxide layer in the region occupied by the rectifying barrier. This oxide layer is chemically bonded to the germanium surface atoms and forms immediately a protecting and passivating surface layer which terminates the unfilled valence bonds of the surface germanium atoms and prevents the acquisition by the surface of traces of harmful contaminants which the surface otherwise tends to acquire.

Although the invention has been described with particular reference to specific embodiments thereof it will be understood that it may be embodied in various other forms without departing from the scope of the invention as defined by the following claims.

I claim:

1. In a method for fabricating a germanium semi-conductor device in which a surface region of a body of germanium extends across a rectifying barrier therein, which method includes the step of cleansing said surface region, the improvement comprising the additional steps of wetting said cleansed surface region with a solution of germanium dioxide and water and then evaporating to dryness said solution on said cleansed surface region, thereby to coat said cleansed surface region with a layer of germanium dioxide.

2. The method of claim 1 in which said cleansing comprises etching of said surface region followed by rinsing thereof.

3. The method of claim 1 in which said wetting is with an aqueous solution saturated with germanium dioxide.

4. In a method for fabricating a semiconductor device comprising a rectifying connection affixed to a body of germanium, which method includes the step of cleansing said connection and the portion of said germanium body adjoining said connection, the improvement comprising the steps of wetting said cleansed connection and said cleansed portion of said germanium body with an $H_2GeO_3$ solution and then evaporating to dryness said solution on said connection and said portion, thereby to coat said cleansed portion and said cleansed connection with a layer of germanium dioxide.

5. The method of claim 4, in which said cleansing is provided by etching followed by rinsing with a liquid free of impurities, in which said wetting is with a solution saturated with germanium dioxide and having a pH of from about 3.1 to about 3.5, and in which said evaporation step comprises heating said body in a gaseous ambient at sub-atmospheric pressure.

6. The method of claim 4, in which said cleansing comprises electrolytically etching said connection and said germanium and then rinsing said connection and said adjacent germanium with deionized water.

7. The method of claim 4, in which said cleansing comprises chemically etching the portion of said germanium body adjacent said connection and rinsing said etched body portion.

8. In a method for reducing the reverse-bias leakage current of a rectifying connection to a body of germanium, where said rectifying connection comprises a body of metal affixed to said germanium body and a potential-barrier region in said germanium body along the periphery of said metal body, which method includes the steps of applying to said metal body and said potential-barrier region a clean-up etchant to remove impurities therefrom and then rinsing said metal body and said potential-barrier region with an inert liquid to remove impurity substances left by said etchant, the improvement comprising the steps of applying a saturated aqueous solution of germanium dioxide to said rinsed metal body and said rinsed potential-barrier region and then heating said solution on said metal body and said potential-barrier region sufficiently to evaporate said solution thereon to dryness, thereby to coat said metal body and said potential-barrier region with a layer of germanium dioxide.

9. A method in accordance with claim 8, in which said metal body is of cadmium and said etchant is potassium hydroxide.

10. A method in accordance with claim 8, in which said connection is an alloy-junction connection comprising cadmium.

11. A method in accordance with claim 8, in which said connection is a surface-barrier connection comprising indium.

12. In a method of increasing the collector-to-base breakdown voltage of a transistor having a body of n-type germanium and a collector connection, said connection comprising a body of acceptor-type metal fused to said germanium body and also comprising a potential-barrier region in said germanium body adjacent the periphery of the area of intersection of said metal body and the surface of said germanium body to which said metal body is fused, which method includes the steps of:

cleansing said metal body and said potential barrier region by directing a stream of potassium hydroxide-containing electrolyte against said metal body and said potential-barrier region while illuminating said region and concurrently applying to said metal body an electrical potential positive with respect to the potential of said stream and of magnitude sufficient to produce electrolytic etching of said germanium body adjacent said rectifying connection, and then rinsing said metal body and said barrier region in a stream of deionized water, thereby to remove contaminants remaining on said barrier region after said electrolytic etching;

the improvement comprising the following steps:

while said barrier region still is wet with said deionized water, applying to said metal body and said barrier region a saturated solution of meta-germanic acid having a pH between about 3.1 and about 3.5; and then heating said germanium body and said metal body, in a gaseous ambient having a maximum pressure of about one micron of mercury, sufficiently to deposit a layer of germanium oxide from said solution onto said barrier region by evaporating said solution to dryness.

13. A method according to claim 12, wherein said metal body comprises cadmium.

14. In a method of reducing the reverse-bias leakage current of a surface-barrier rectifying connection to a body of n-type germanium, where said rectifying connection comprises a body of acceptor-type metal deposited on a surface of said germanium body and a potential-barrier region in said germanium body contiguous with the periphery of the area of intersection of said metal body and said surface, which method includes the steps of:

cleansing said metal body and said potential barrier region by applying an acid chemical etchant to said barrier region and said metal body for a time sufficient to etch said barrier region, and then rinsing said metal body and said barrier region with deionized water, thereby to remove contaminants remaining on said barrier region after said chemical etching;

the improvement comprising the following steps:

while said barrier region still is wet with said deionized water, applying to said metal body and barrier region a saturated solution of meta-germanic acid having a pH between about 3.1 and about 3.5; and then heating said germanium body and said metal body, in a gaseous ambient having a maximum pressure of about one micron of mercury, sufficiently to deposit a layer of germanium oxide from said solution onto said barrier region by evaporating said solution to dryness.

15. A method according to claim 14, wherein said metal body comprises indium.

16. A method according to claim 1, wherein said step of evaporating said solution comprises the step of heating said germanium body in a gaseous ambient having a maximum pressure of the order of one micron of mercury.

17. A method according to claim 4, wherein said step of evaporating said solution comprises the step of heating said germanium body in a gaseous ambient having a maximum pressure of the order of one micron of mercury.

18. A method according to claim 8, wherein said step of evaporating said solution comprises the step of heating said germanium body and said metal body in a gaseous ambient having a maximum pressure of about one micron of mercury.

References Cited by the Examiner

UNITED STATES PATENTS

| | | | |
|---|---|---|---|
| 2,930,949 | 3/1960 | Roschen | 317—235 |
| 2,974,075 | 3/1961 | Miller | 156—17 XR |

OTHER REFERENCES

Journal of the Electrochemical Society, vol. 103, No. 4, The Anode Behavior of Germanium in Aqueous Solutions by Turner, April 1956, pp. 252–256 relied on.

EARL M. BERGERT, *Primary Examiner.*

JACOB STEINBERG, *Examiner.*